(12) United States Patent
Nemazie et al.

(10) Patent No.: US 9,224,504 B2
(45) Date of Patent: Dec. 29, 2015

(54) MAPPING OF RANDOM DEFECTS IN A MEMORY DEVICE

(71) Applicant: Avalanche Technology, Inc., Fremont, CA (US)

(72) Inventors: Siamack Nemazie, Los Altos Hills, CA (US); Ebrahim Abedifard, San Jose, CA (US)

(73) Assignee: AVALANCHE TECHNOLOGY, INC., Freemont, CA (US)

( * ) Notice: Subject to any disclaimer, the term of this patent is extended or adjusted under 35 U.S.C. 154(b) by 0 days.

(21) Appl. No.: 14/497,091

(22) Filed: Sep. 25, 2014

(65) Prior Publication Data

US 2015/0012784 A1    Jan. 8, 2015

Related U.S. Application Data

(62) Division of application No. 13/175,801, filed on Jul. 1, 2011, now Pat. No. 8,887,013.

(51) Int. Cl.
| | |
|---|---|
| G11C 29/00 | (2006.01) |
| G06F 11/20 | (2006.01) |
| G11C 29/44 | (2006.01) |
| G06F 3/06 | (2006.01) |

(52) U.S. Cl.
CPC .............. G11C 29/72 (2013.01); G06F 3/0619 (2013.01); G06F 3/0638 (2013.01); G06F 3/0679 (2013.01); G06F 11/2094 (2013.01); G11C 29/4401 (2013.01); G11C 29/808 (2013.01); G06F 2212/1032 (2013.01); G06F 2212/69 (2013.01)

(58) Field of Classification Search
CPC ...... G11C 27/72; G11C 27/76; G11C 27/812; G11C 29/78; G11C 29/785; G11C 29/80
See application file for complete search history.

(56) References Cited

U.S. PATENT DOCUMENTS

| | | | | |
|---|---|---|---|---|
| 4,751,656 A * | 6/1988 | Conti | .................... | G11C 29/72 714/711 |
| 5,179,536 A * | 1/1993 | Kasa | .................... | G11C 11/407 365/185.04 |
| 5,195,057 A * | 3/1993 | Kasa | .................... | G11C 29/838 365/189.07 |
| 5,983,374 A * | 11/1999 | Todome | ................. | G11C 29/72 714/711 |
| 6,115,828 A * | 9/2000 | Tsutsumi | ............. | G11C 29/789 365/200 |
| 6,259,636 B1 * | 7/2001 | Fukuda | ................ | G11C 29/808 365/200 |
| 6,421,286 B1 * | 7/2002 | Ohtani | ................... | G11C 29/44 365/189.07 |
| 7,055,013 B2 * | 5/2006 | de Br bisson | ....... | G06F 11/1666 369/47.14 |
| 7,092,289 B1 * | 8/2006 | Wong | .................... | G11C 5/025 365/185.09 |
| 7,437,627 B2 * | 10/2008 | Frankowsky | .......... | G11C 29/44 365/200 |
| 8,839,053 B2 * | 9/2014 | Schechter et al. | .. | G06F 11/1048 714/710 |

* cited by examiner

*Primary Examiner* — Steve Nguyen
(74) *Attorney, Agent, or Firm* — Maryam Imam; IPxLaw Group LLP

(57) ABSTRACT

A memory device includes a memory array with random defective memory cells. The memory array is organized into rows and columns with a row and column identifying a memory location of a memory cell of the memory array. The memory device includes a row address device and a column address device and is operative to use a grouping of either the row or the column addresses to manage the random defective memory cells by mapping the memory location of a defective memory cell to an alternate memory location.

8 Claims, 7 Drawing Sheets

MAPPING OF RANDOM DEFECTS IN A MEMORY DEVICE

CROSS REFERENCE TO RELATED APPLICATIONS

This application is a divisional application of U.S. patent application Ser. No. 13/175,801, filed by Siamack Nemazie, et al., on Jul. 1, 2011, and entitled "Mapping of Random Defects in a Memory Device".

BACKGROUND OF THE INVENTION

1. Field of the Invention

The invention relates to a memory device having a memory array and particularly to managing random defects in memory locations of the memory array of the memory device.

2. Description of the Prior Art

Memory arrays have a variety of applications nearly all of which require reliability of the memory locations of such arrays. However, as readily known in the industry, memory arrays, which are organized in rows and columns of memory cells, readily include defective memory cells, which are generally identified prior to the memory array leaving its place of manufacturing. These defects are characterized as "massive" defects and "random" defects. "Massive" defects generally refer to defects that render an entire row or column defective or that are greater than that which is statistically considered random defects, whereas "random" defects appear more randomly in memory cells with no particular known pattern, such as in a row or a column of the memory array.

Both massive as well as random defects require management if the memory array is to be used in any practical memory application. The management of such defects is typically done by circuitry that controls the memory array. In the case of massive defects, an entire row or column is identified as defective and the defective row/column is replaced with a spare row/column by the circuitry that controls the memory array. This replacement prevents further use of the defective row and/or column for the entire remaining life time of the memory array. As can be appreciated, this type of defect management is not efficient for the case of random defects because an entire row or an entire column of memory cells is likely rendered unusable even though as few as one memory cell in the row or column may be defective.

Magnetic random access memory (MRAM) is a prime candidate for having random defects due to the non-uniform etching process and other processes employed during its manufacturing, MRAM memory cells typically experience random defects as opposed to massive defects or in some cases, in addition to massive defects. MRAM is quickly gaining wide popularity in various applications oftentimes replacing its current counterpart non-volatile memory and is anticipated to replace volatile memory in the near future. Therefore, the efficient management of random defects in a memory array that is made of MRAM memory cells is vital.

Techniques currently employed to manage random defects suffer from being costly due to their use of large memory. That is, circuits designed to manage defects map a defective address to a spare memory area, which is typically made of content addressable memory content-addressable memories (CAMs). CAMs operate by checking an incoming address, which is an input to the CAM, against its content and outputting a signal that reflects whether or not there is a match and an alternate address. Current defect management techniques use this as a way to identify a defective memory location in that defective addresses, as they are identified during manufacturing, are stored in the CAM so that when there is a match between the input of the CAM and the content of the CAM, a defective memory location is identified and an alternate address generated. When a cell being accessed is identified to be defective, the incoming address thereof is replaced with an alternate address associated with a spare cell. As can be appreciated, the shortcoming with this technique is that a large CAM is required, causing valuable real estate in addition to increased costs to the point of being impractical. In some current designs, two CAMs are employed, one for maintaining defective row addresses and another for maintaining defective column addresses, which is a costly solution for managing random defects as each random defect is mapped to a spare row (or column) which increases the memory array, among perhaps others.

Thus, the need arises for a memory device with an efficient and cost effective method and apparatus to manage random defects in its memory array.

SUMMARY OF THE INVENTION

To overcome the limitations in the prior art described above, and to overcome other limitations that will become apparent upon reading and understanding the specification, the invention discloses.

Briefly, in accordance with a method of the present invention, random defects of a memory array in a memory device are mapped by receiving an incoming address that identifies a memory location to be accessed in the memory array, the memory array being made of a plurality of memory cells arranged in an array of rows and columns. The incoming address includes a row address and a column address, a row address and a column address identifies a memory location of a memory cell of the memory array. The row address belongs to a group of row addresses such that each group has no more than one defective memory cell per column, and each group is assigned an alternate row address or an index, further, for each column address each group is assigned a defective row address. The method further determines whether or not the incoming column address identifies a defective column and if it is determined that the incoming column address identifies a defective column, the incoming column address is replaced with an alternate column address for identifying the alternate memory location in the memory array. Additionally, the method determines whether or not the incoming row address identifies a defective row and if the incoming row address identifies a defective row, the incoming row address is replaced with an alternate defective row address for identifying the alternate memory location in the memory array, otherwise, a determination is made as to whether or not the incoming address identifies a (random) defective memory cell and if so, the incoming row address is replaced with the alternate row address that is to be used for identifying the alternate memory location in the memory array.

These and other objects and advantages of the present invention will no doubt become apparent after having read the following detailed description of the preferred embodiments illustrated in the several figures of the drawing.

IN THE DRAWINGS

DETAILED DESCRIPTION OF THE PREFERRED EMBODIMENTS

In the following description of the embodiments, reference is made to the accompanying drawings that form a part hereof, and in which is shown by way of illustration of the specific embodiments in which the invention may be practiced. It is to be understood that other embodiments may be utilized because structural changes may be made without departing from the scope of the present invention. It should be noted that the figures discussed herein are not drawn to scale and thicknesses of lines are not indicative of actual sizes.

In accordance with an embodiment of the present invention, a method of managing random defects in a memory array of a memory device is disclosed. The memory array is organized into rows and columns, with a row and a column identifying a memory location identifying a memory cell. This method includes receiving an incoming address that identifies a memory location to be accessed, within a memory array. The incoming address includes a row address and a column address, the row address belongs to a group of row addresses that are associated with a number of column addresses, each of the associated plurality of column addresses of a group of row addresses identifies no more than one defective memory cell. The method further determines whether or not the incoming address identifies a defective memory cell and if so, an alternate row address is identified.

For each group of row addresses, a defective row address is identified using the incoming column address and the incoming row address is compared against the defective row address of each group and if a match is found between the incoming row address and the defective row address of any of the groups, the incoming row address is replaced with the alternate row address, the alternate row address being used to identify an alternate (or "spare") memory location in the memory array for accessing the memory cell. The method further determines whether or not the incoming column address is associated with a defective memory column and if so, the incoming column address is replaced with an alternate (or "spare") column address that is used to identify the alternate memory location in the memory array.

Figure 1:
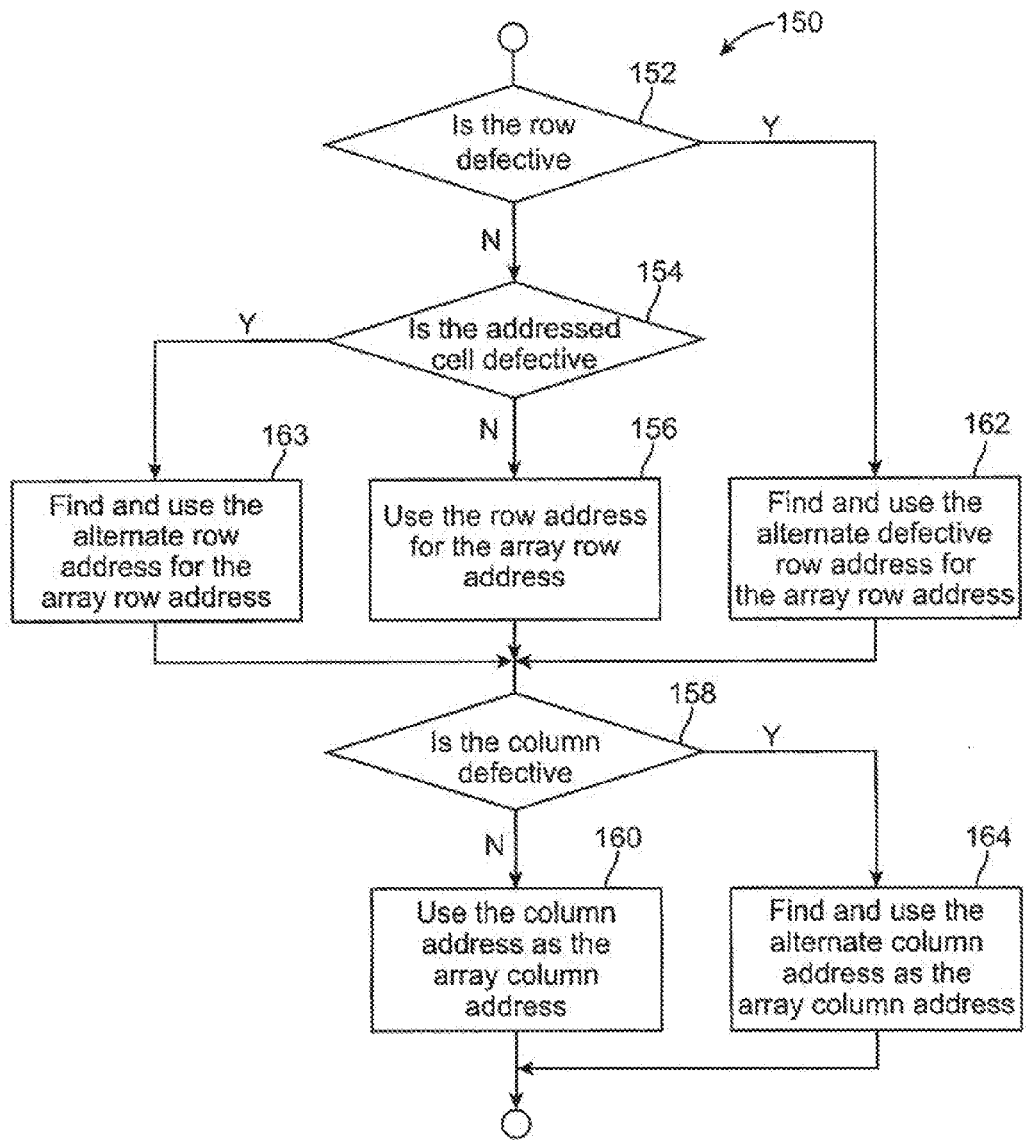
FIG. 1 shows a high-level flow chart of generally the relevant steps performed in replacing a defective row/column, in accordance with a method of the present invention.

FIG. 1 shows a high-level flow chart of generally the relevant steps performed in replacing a defective row/column, in accordance with a method of the present invention. The process 150 is shown to start with a determination, at 152, of whether or not the row that is being accessed is defective and if so, the process proceeds to step 162, otherwise, the process proceeds to 154. When a row is determined to be defective at 152, this is a "massive" defect, as discussed previously.

At step 162, an alternate (or spare) defective row address is used as the memory array row address, which is the address of the row that is to be accessed in the memory array of interest. Next, the process continues to 158.

At 154, another determination is made, this time, as to whether or not, the addressed memory cell is defective and if so, the process proceeds to step 163 where the alternate row address is used as the memory array row address, otherwise, the process continues to step 156 where the incoming row address is maintained as the row address for accessing the memory array and no alternate row address is employed. After step 156, the process continues to 158, where a determination is made as to whether or not the incoming column is defective and if so, the process continues to the step 164, otherwise, the step 160 is performed. The determination at 158 is a determination of a massive defect in the column and not a random defect, as is done at 152, whereas, the determination at 154 is a determination of the presence of a random defect, as opposed to a massive defect.

If there is no massive column defects spotted at 158, the step 160 is performed where the column address used to access the memory array is the incoming column address and not an alternate column address but upon a determination, at 158, that the column is defective, the step 164 is performed where an alternate (or spare) column address is used to access the memory array.

Figure 2:
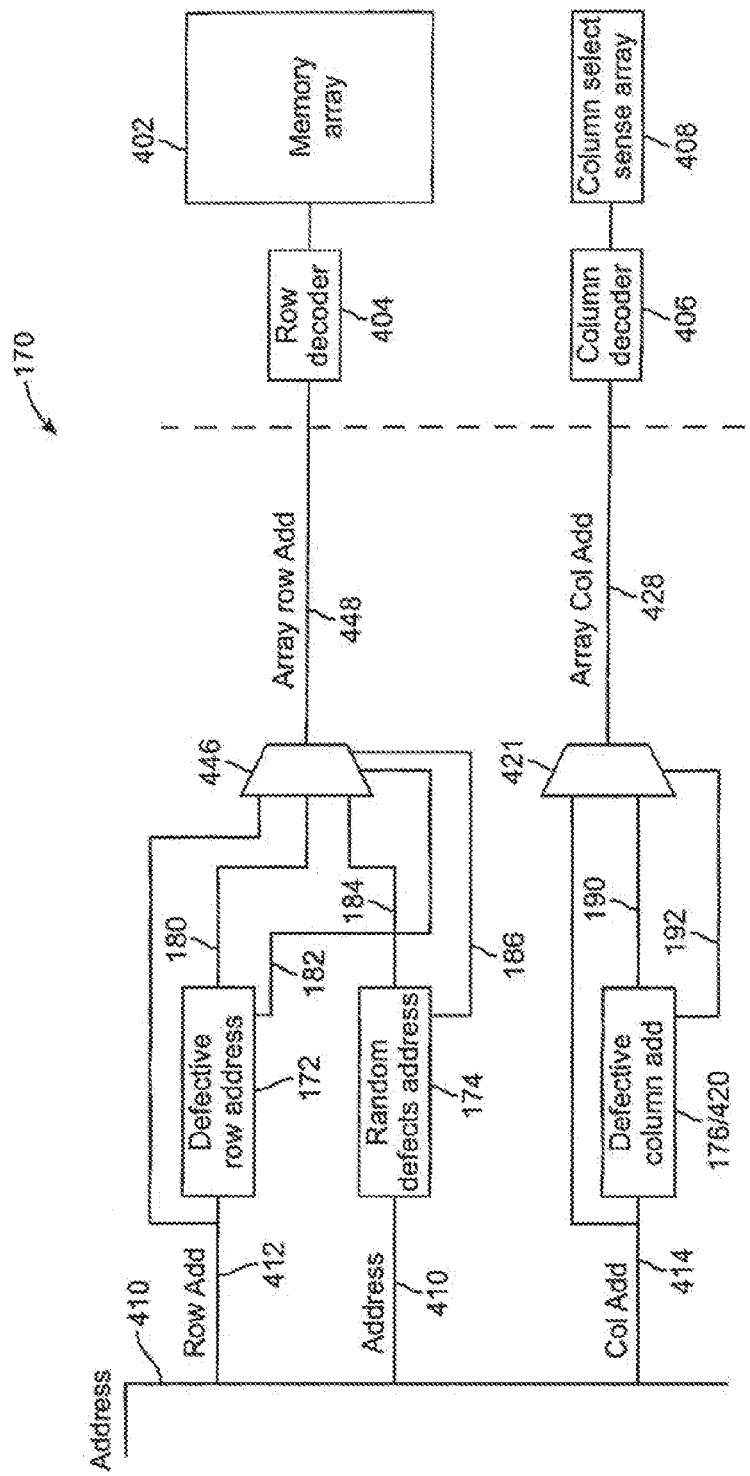
FIG. 2 shows a high-level block diagram generally carrying out the steps of FIG. 1, in accordance with an embodiment of the present invention.

FIG. 2 shows a high-level block diagram generally carrying out the steps of FIG. 1, in accordance with an embodiment of the present invention. In FIG. 2, a memory device 170 is shown to include a defective row address map 172, a random defects address 174 map, a defective column address map 176, a memory array row address select 446, a memory array column address select 421, a row decoder 404, a column decoder 406, a column select/sense amplifier 408, and a memory array 402, in accordance with an embodiment of the present invention.

As is known to those in the art, the row decoder 404, column decoder 406 and the column select/sense amplifier 408 are used to access a particular memory location with the memory array 402. The column select 408, as again generally known, includes sense amplifiers. The column decoder 406 works in conjunction with the column select 408 to identify a column in the memory array 402. The row decoder 404 identifies a row in the memory array 402.

The input to the row decoder 404 is the memory array row address 448, provided by the select 446, and the input to the column decoder 406 is the memory array column address 428, provided by the select 421.

The defective column address map 176, receives column address 414, which is included in the incoming memory address 410, and generates a match signal 192 that indicates a match occurred or not and an alternate column address 190, to the select 421. The select 421 also receives the column address 414 as another one of its inputs. In some embodiments, the address 176 is a CAM and generates a match signal 192 to the select 421 to select either one of its other two inputs to pass through as the address 428 based on whether or not the column address 414 is defective on a massive scale, such as determined at 158, in FIG. 1. Accordingly, if the column address 414 is determined to be defective, the select 421 chooses to pass the alternate column address 190 as the address 428 (an alternate column address is used in this case, such as shown at the step 164 in FIG. 1) and if not, the select 421 chooses to pass through the column address 414 as the address 428 (as done at step 160 in FIG. 1).

Row address selection is done differently than column address selection, in FIG. 2, accordance with one embodiment of the present invention where random defects in a row are managed to avoid replacement of an entire row for a non-massive defect situation. Thus, the address 172 processes massive row defects whereas the address 174 processes random row defects. The address 172 receives as its input, the row address 412, which is included in the address 410 and generates a match signal 182 that indicates a match occurred or not and an address that is an alternate defective row address 180 if the row address 412 is defective. The address 174 receives as its input, the address 410 and generates a match signal 186 that indicates a match occurred or not and an address that is an alternate row address 184 if the addressed cell is defective. Further, the match signals 182 and 186 are select signals to the select 446 for use in choosing which of the select 446's inputs, i.e. the address 412, alternate defective row address 180 or alternate row address 184 the select 446 chooses to pass through as the memory array row address 448. In other embodiments the address 174 may receive part of address 410 instead of the full address. The random defects are all mapped to spares cells wherein the column address of the spare cell is the same as column address of the random defective cell if the column was not massively defective. This is further explained further below with reference to FIG. 4. This results in a smaller CAM.

Accordingly, the address 174 and the select 446 enable re-use of the same spare row to store defective memory cells thereby making efficient use of the array 402 because less spare rows are required than that required by prior art techniques. The address 172 processes massive defects in a row where re-use of a spare row is not possible and address 176 processes massive defects in a column where re-use of a spare column is not possible.

Figure 3:
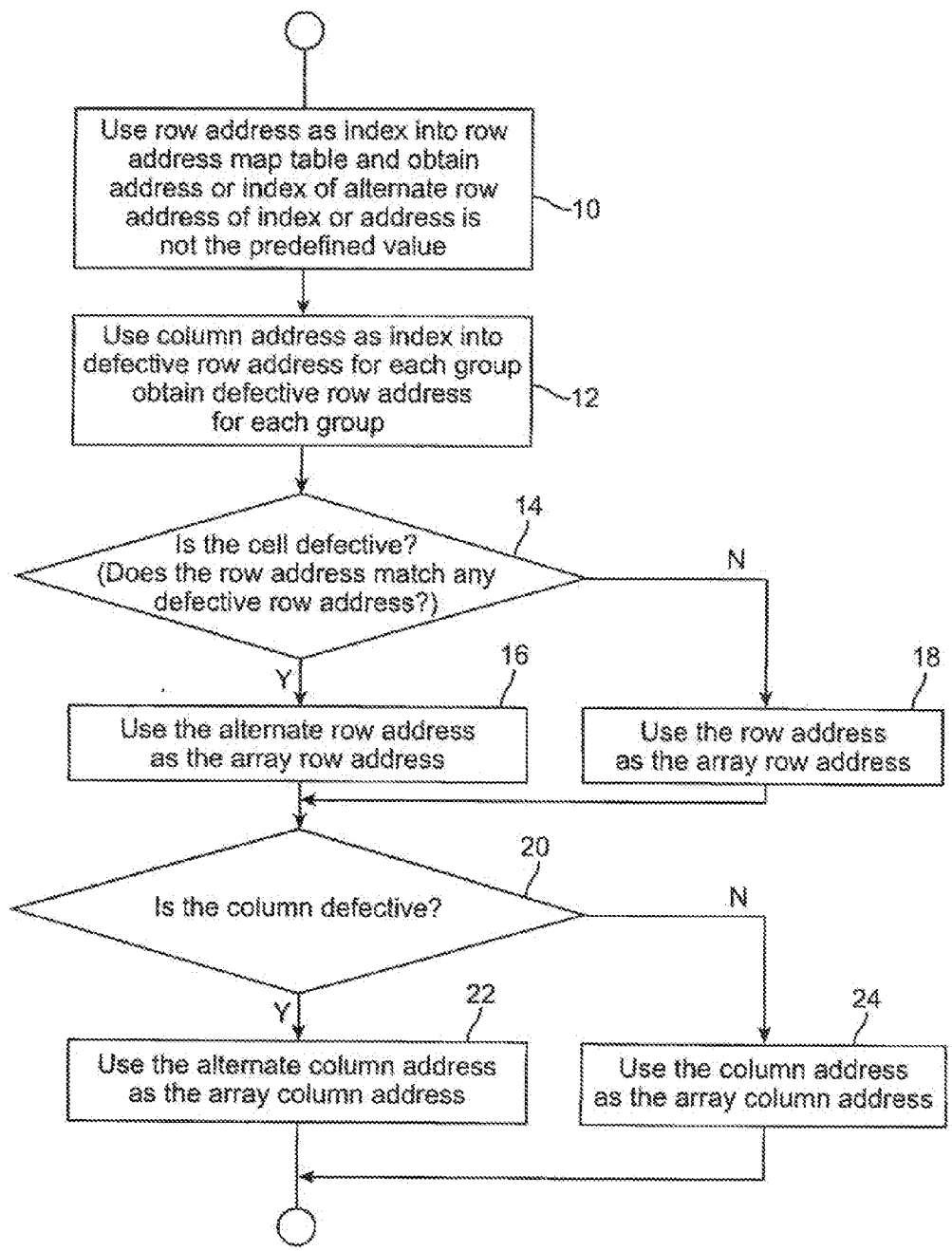
FIG. 3 shows a flow chart of the relevant steps performed in managing a random defect in a memory array of a memory device by mapping the memory location of the defective memory cell to an alternate memory location, in accordance with an embodiment of the present invention.

FIG. 3 shows a flow chart of the relevant steps performed in managing a random defect in a memory array of a memory device by mapping the memory location of the defective memory cell to an alternate memory location, in accordance with an embodiment of the present invention. The flow chart of FIG. 3 begins by assuming that a defective memory location has been identified. At step 10, a row address of an incoming memory address that has a row address (also referred to herein as "incoming row address") and a column address (also referred to herein as "incoming column address") identifying a particular memory location is used as an index into a row address map table to obtain an alternate address, or an index, as the case may be, and is compared to a predetermined (or "pre-defined") value to identify whether or not the incoming memory address is identifying a defective row or a (random) defective memory location. By way of example, the identification of a defective memory row is done by setting a bit to a binary value of "1" or "0" in the alternate address, which is effectively a form of a flag indicative of whether or not the particular memory location is defective.

It is noted that the steps of FIG. 3 show a process for managing random defects and not only massive defects.

After step 10, at step 12, the column address of the incoming memory address is used as an index into the defective row address for each group of memory locations to obtain a defective row address for each group. Identification of groups is performed prior to the steps of FIG. 3 and generally during manufacturing. A method for identification of groups is shown and discussed later relative to subsequent figures.

Next, at step 14, a determination is made as to whether or not the memory cell being accessed and identified by the incoming memory address is defective and if so, the process continues to step 16, otherwise, the process continues to step 18. At step 18, the memory cell is presumed not to be defective and the row address of the incoming memory address is used as the row address of the memory array, referred to as the "memory array row address" and the process continues to 20. At step 16, an alternate row address is used as the memory array row address. This alternate row address identifies a row that is in a predetermined spare area of the memory area. Next, the process continues to 20 where a determination is made as to whether or not, the column address of the incoming memory address is defective and if this determination yields a positive result, the process continues to step 22, otherwise, the process continues to step 24.

At step 24, because the column address was declared non-defective at 20, it is used as the memory array column address. At step 22, because the column address of the incoming memory address was declared defective at 20, an alternate column address is used as the memory array column address, wherein the defects in the group of rows with no more than one defect per column are all mapped to cells in the same alternate row address and the same array column address.

Figure 4A:
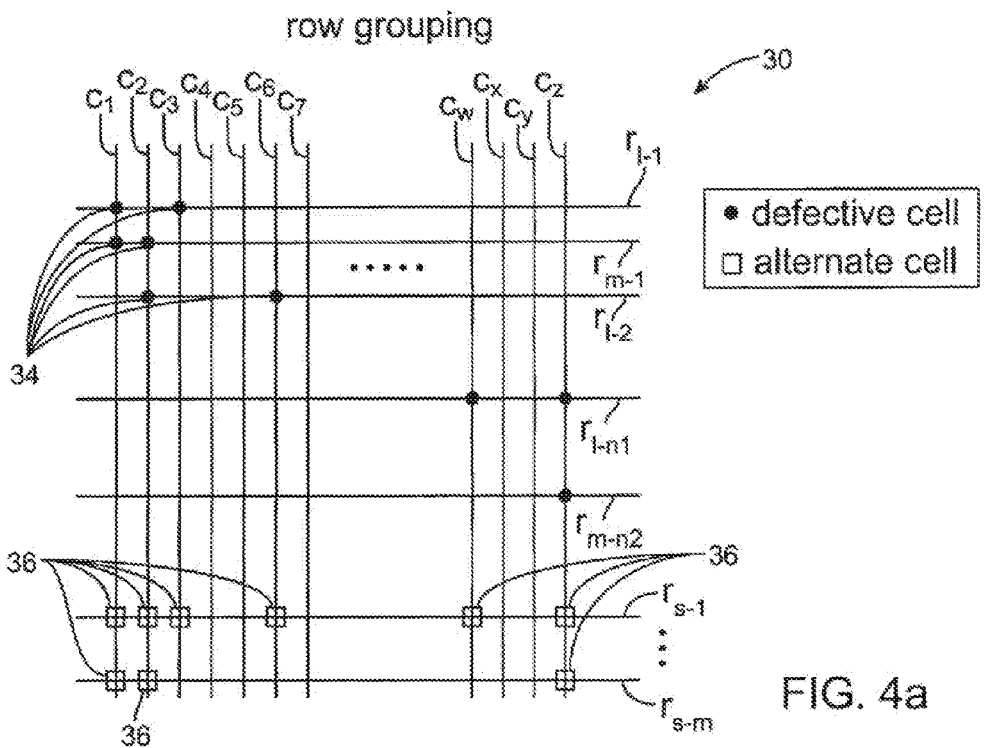
FIG. 4a shows a portion of exemplary memory array of a memory device where grouping of rows is shown and spare row addresses are employed.

FIG. 4a shows a portion of exemplary memory array of the memory device where grouping of rows is shown and spare row addresses are employed. That is, the memory array 30 is shown arranged in rows and columns with the rows are identified by a designation of "r", followed by numbers, which are separated by a period "." Accordingly, the first row is referenced by "r1.1" where "r" stands for "row", "1" after "r" indicates the group number and the "1" after the "." indicates the number of the row in the, thus, the second row is referenced by "rm.1" indicating that this row belongs to group m but that it is the first row of that group. "m" is an integer value. Similarly, additional rows of various groups are shown down to the row "rs.m" with "s" representing a "spare" row and the group of spare or alternate rows being rs.1 to rs.m.

The columns of the memory array 30 are indicated by "c" followed by a number with the last columns being indicated by the letters "w", "x", "y" and "z" to emphasize an unknown number of columns. Each of the "w", "x", "y", and "z" are integer values. Further, a number of defective memory cells are shown by the representation "o" (or a circle) and a number of alternate cells are shown by the designation of a square. For example, the memory cells at 34 are defective memory cells and the memory cells at 36 are alternate (also known as "spare") memory cells.

Figure 4B:
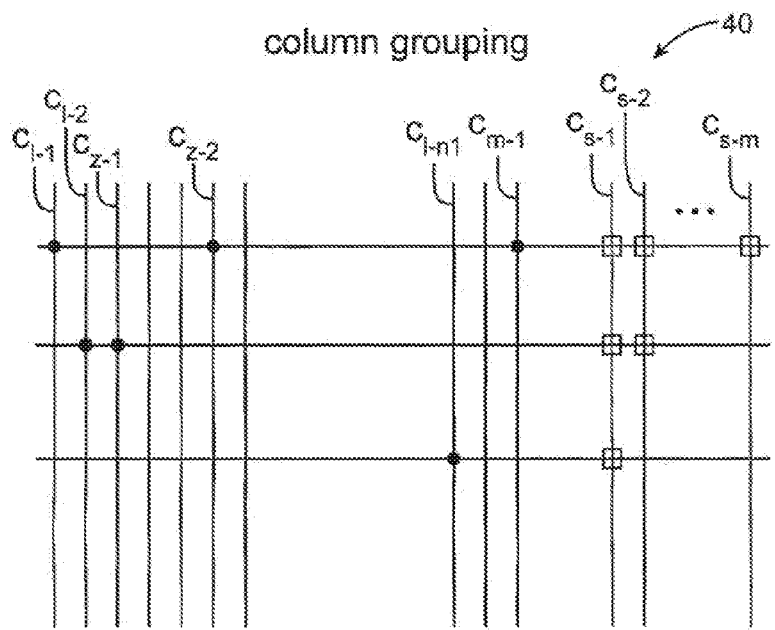
FIG. 4b shows a portion of exemplary memory array of a memory device where grouping of columns is shown and spare column addresses are employed.
Figure 5:
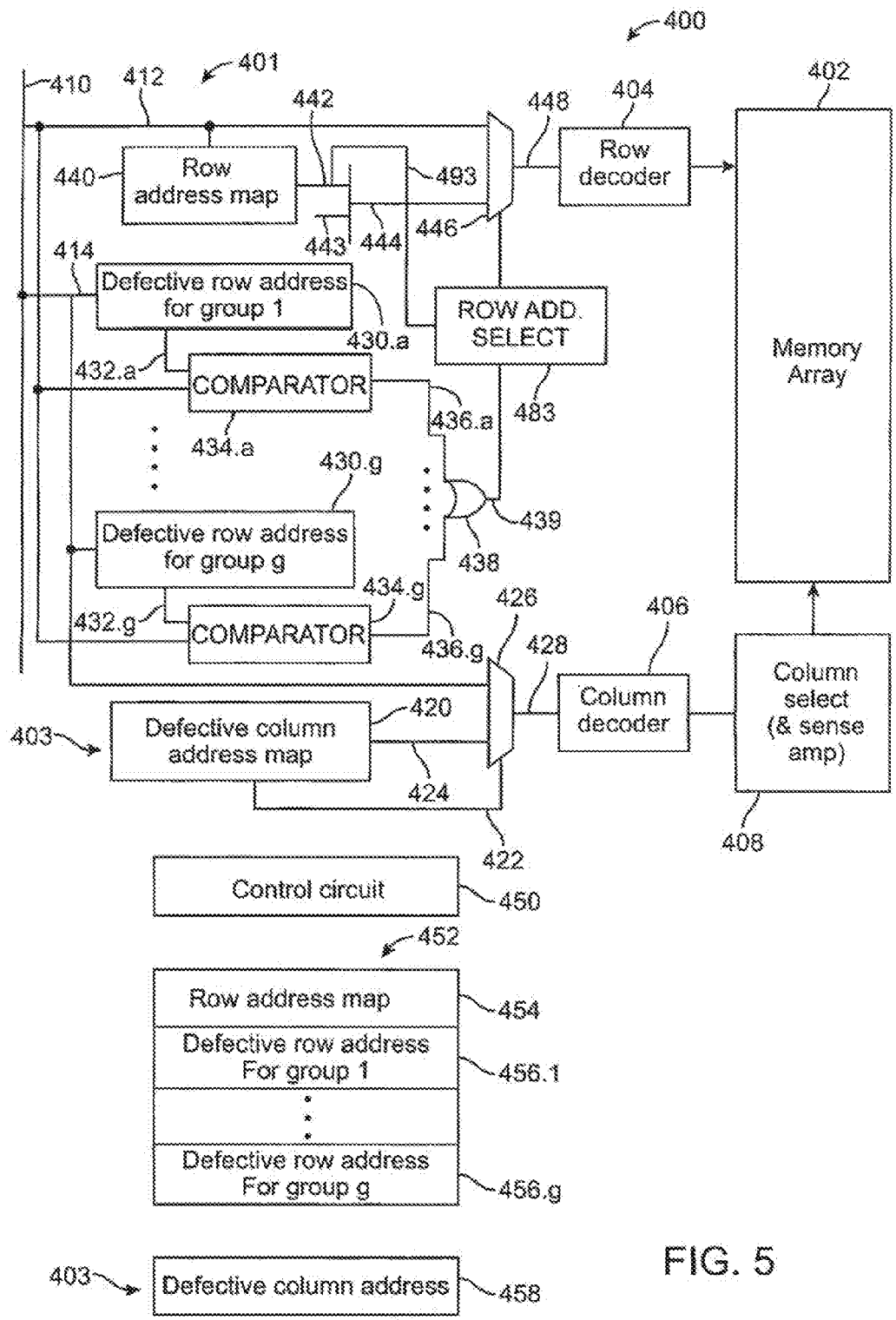
FIG. 5 shows a high level block diagram of a memory device 400, in accordance with an embodiment of the present invention.

In an embodiment and method of the present invention, the grouping of rows is done such that only up to one defective memory cell of a given column is tolerated before more than one spare row need be used, which essentially defines a group. For example, because 2 defective memory cells appear on three columns, i.e. column c1 column c2, and column cz two spare rows need be identified as alternate rows for the defects rs.1 for group 1 and rs.m The random defective cells are mapped to a spare cell in the same column. FIG. 4b shows a portion of exemplary memory array of the memory device where grouping of columns is shown and spare column addresses are employed. Accordingly, rather than designated spare rows, such as shown in FIG. 4a, spare columns, cs.1 thorough cs.m, are employed. Analogous to FIG. 4a, when more than one defective memory cell in a given row is detected, more than one spare column need be employed because a group in this case is defined by no more than one defective memory cell in a given row. Note that the random defective cells are mapped to a spare cell in the same row FIG. 5 shows a high level block diagram of a memory device 400, in accordance with an embodiment of the present invention. The device 400 is one of many ways of implementing defect management in accordance with the teachings of the present invention and that other ways, structures, circuits, software programs, and other suitable means of implementing the defect management of the present invention are contemplated.

The device 400 is shown to include a memory array 402 coupled to a row address device 401 and a column address device 403. Further, the device 400 is shown to include a control circuit 450 for generating certain control signals, readily known to those skilled in the art, used by the devices 401 and 403 and the memory array 402, such as those used by the device 401 to extract the incoming row address and those used by the device 403 to extract the incoming column address.

The device 401 is shown to include a row address map 440, 'g' number of defective row address table 430.a through 430.g, with 'g' being an integer value, 'g' number of row address comparators 434.a through 434.g, a memory array row address select 446, a defective cell detector 438, and a row address select 483.

The device 403 is shown to include the defective column address map 420, and a memory array column address select 421.

The device 400 is shown to include a non-volatile defective address store 452 and a defective column address 458. The non-volatile defective address store 452 is shown to include 'g' number of defective row address table 456.a through 456.g and row address map 454.

In alternative embodiments, the store 452 and the address 458 reside externally to the memory device 400.

The map 440 is a look-up-table that receives an incoming row address 412, which is extracted from the incoming memory address 410. Similarly, each of the defective row address tables 430.a through 430.g receive an incoming column address 414, extracted from the address 410 and they are also each effectively a look-up-table. The map 440 uses the address 412 as index to obtain the address (or index) of the alternate row address and when an index is obtained (as in this embodiment), it is concatenated with the spare row base address 443 to generate the alternate row address 444. The select 446 selects to output either the address 412 or the address 444, based on the state of the row address select signal 439 and accordingly generates the memory array row address 448, which is received by the row decoder 404. As known in the art, the row decoder 404 is used to access a memory location within the memory array 402.

The map 440 essentially performs the step 10 of FIG. 3 by using the incoming row address 412 as an index to generate an address or an index of an alternate (or "spare") row address, the index 442. That is, the index 442 may be an address or an index of an address (also referred to as "partial row address"). In the case of the latter, further circuitry or functionality is required to process the index, as this is a partial address.

The tables 430.a through 430.g effectively implement the step 12 of FIG. 3. The tables 430.a through 430.g, each are responsive to the incoming column address 414 and uses the same to generate a defective row address 432.a for group a through 432.g for group g, respectively, which are each an address or an index. Assuming the incoming memory address 410 identifies a defective memory cell, one of the tables 430.a through 430.g generates a defective row address, which is compared against the incoming row address. That is, each of the comparators 434.a through 434.g compares the incoming row address 412 to an output of the address 430, or output 432.a through 432.g, respectively, to determine whether or not the memory location being accessed, i.e. the memory cell, is defective, which is effectively carrying out 14 in FIG. 3. Each of the comparators 434.a through 434.g generates a defective row address match 436.a through 436.g, respectively. The matches 436.a through 436.g are each used to determine whether any is active by the detector 438, which in one embodiment is an 'OR' gate that generates the signal 439. That is, if any of the comparators 434 yield a match, the incoming row address 412 is addressing memory cells with random defect(s) which means that the memory cell being accessed is defective. Where there is a match found by the detector 438, based on the state of the flags 493, which are included in the index 442, the alternate row address 444 may be selected by the select 446 as opposed to the incoming row address 412, which is effectively the step 16 in FIG. 3 with the determination at 14, in FIG. 3, being performed by the comparators 434, the detector 438, the row address select 483, and the select 446. More specifically, the flags 493 serves as input to the row address select 483, which also receives as input, the flags 493, and based on these two inputs, the select 483 chooses to output, as address 448, the row address 412 or the address 444.

Where there is no defect, the select 446 chooses the incoming row address 412 as its output, which is the memory array row address 448. The address 448 serves as input to the row decoder 404, which selects the row to be accessed in the memory array 402. Similarly, the column address 408 selects the column to be accessed in the memory array 402.

It is noted that the "spare" or "alternate" row and column addresses are kept in the memory array 402. The memory arrays 30 and 40 of FIGS. 2a and 2b, respectively are portions of the memory array 402 of FIG. 5.

An example of the state of the flags 493 is shown in Table 1 below:

TABLE 1

| Flag 1 | Flag 2 | M (439) | Description |
|---|---|---|---|
| X | 0 | X | No defect in the row (select row address) |
| 1 | 1 | X | Defective row (select alt. row address) |
| 0 | 1 | 0 | Cell is not defective (select row add.) |
| 0 | 1 | 1 | Cell is defective (select alt. row add.) |

The memory array 402 is organized into a number of rows and columns, as readily known to those in the art and can be made of a variety of memory cells, such as SRAM, non-volatile RAM (NVRAM) (examples of which include NOR Flash and NAND Flash), and MRAM.

The map 420 receives as input the incoming column address 414, which it uses to generate the column alternate address when a defective column address is detected. That is, the map 420 is effectively a CAM that searches for an address that matches its input, the address 414, and if a match is detected, the address of an alternate column address, which is previously stored in the map 420 becomes the address 424, additionally, the column address match is generated by the map 420 to indicate the presence of a defective column or not. Accordingly, when a match is detected, the match 422 causes the select 421 to choose the address 424 rather than the address 414. More specifically, the select 421 receives the addresses 414 and 424 as input and selects to output one or the other based on the state of the match 422. The output of the select 421 is the memory array column address 428, which serves as input to the column decoder 406. The decoder 406 decodes the address 428 and outputs the decoded address to the column select 408, which selects a column to access in the memory array 402.

In some embodiments, the map 420 is a look-up-table.

In embodiments where the map 420 is a CAM, in an alternate embodiment, the CAM includes field entries with each entry having a first field and a second field and first, the address 414 is used to search the first field and if a match is detected, then the second field is output.

In some embodiments, the map 420 and tables 430.a through 430.g are each CAMs.

The store 452 and the address 458 store values of defects that load values into map 440 and tables 430, and map 420 respectively, after each power-on and are therefore made of non-volatile memory. In some embodiments, the store 452 and the address 458 are not needed, such as in the case where the array 402 or map 420 and tables 430.a through 430.g is made of MRAM memory cells because MRAM is as small and as fast as static random access memory (SRAM), and can therefore be used to store the information that would be stored in the store 452 and the address 458.

In non-MRAM applications, the map 440, the tables 430 and map 420 are random access memory (RAM), such as SRAM, or CAM in an effort to increase performance. That is, as is well known, mapping defective memory cells eats into memory access time, thus, it is important to access these tables fast or efficiently and for this reason, SRAM or volatile CAM is a suitable candidate due to its fast access speed.

Figure 6:
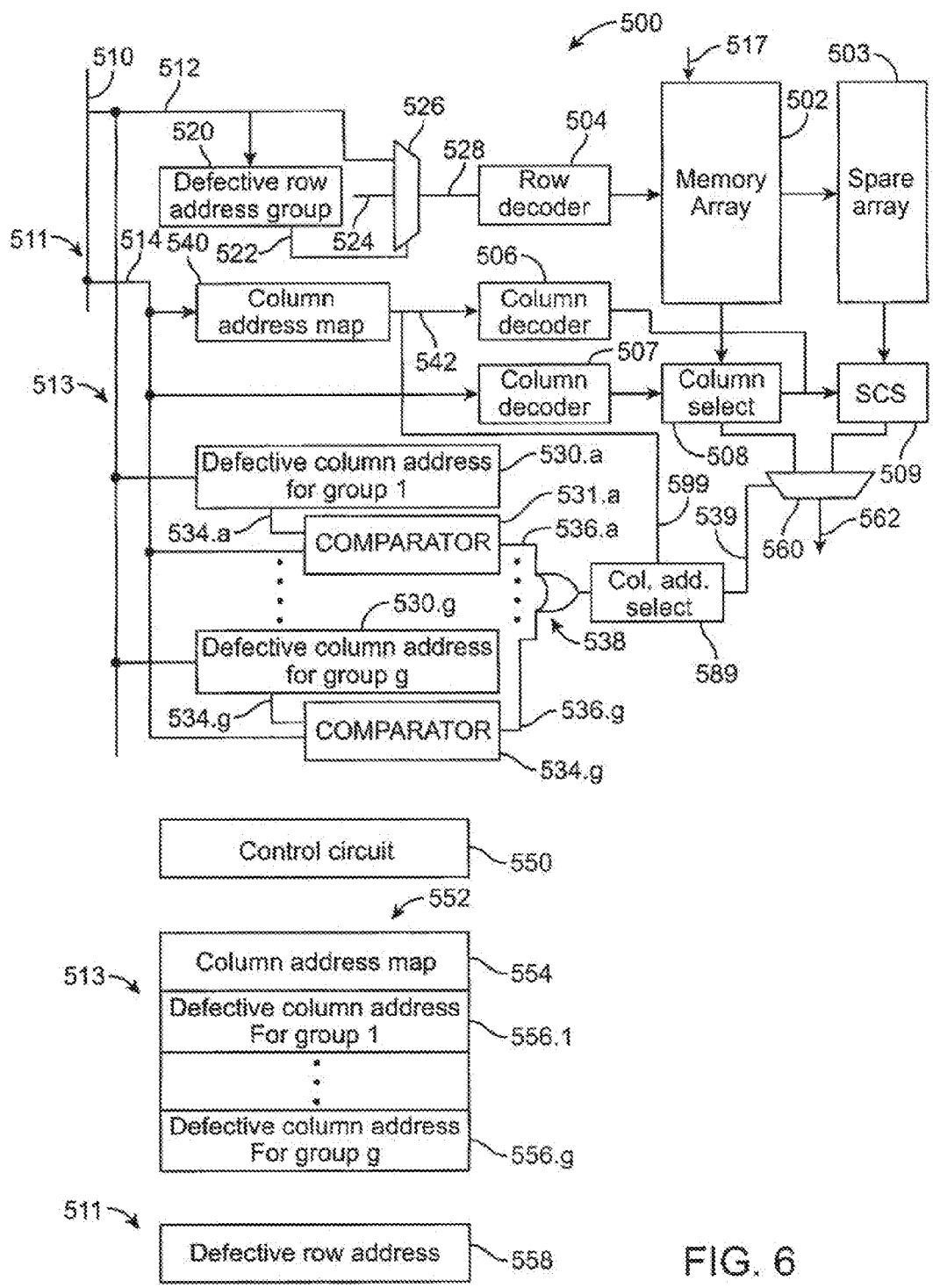
FIG. 6 shows a high level block diagram of a memory device 500, in accordance with an embodiment of the present invention.

FIG. 6 shows a high level block diagram of a memory device 500, in accordance with an embodiment of the present invention. The memory device 500 is analogous to the memory device 400 except that column grouping rather than row grouping is performed and is understood to adversely affect the memory access time less than the memory device 400 does. Accordingly, in the memory device 500, spare column are grouped together and accessed at the same time as when the memory array 502 of the memory device 500 is accessed. That is, the spare array 503 is accessed at the same time as when the memory array 502 is accessed.

More specifically, the device 500 is shown to include a row address device 511, a column address device 513, a control circuit 550, a memory array 502 and a spare array 503. The control circuit 550 is analogous to the control circuit 450 a column decoder 506, a spare array column decoder 507, column select 508, a spare array column select 509, an output select 560. The device 511 is shown to include a defective row address 520, a row address select 526, a row decoder 504. The device 513 is shown to include a column address map 540.

The device 500 is shown to include a non-volatile defective address store 552 and a defective row address 558. The non-volatile defective address store 552 is shown to include 'g' number of defective column address table 556.a through 556.g and column address map 554.

In alternative embodiments, the store 552 and the address 558 reside externally to the memory device 500.

The defective address store 552 is analogous to the store 452 except that it is regarding column addresses rather than row addresses. That is, it maintains defective column addresses for use by the addresses 530.a through 530.g and column address map 540 and loads the latter upon power-up. The control circuit 550 is analogous to the control circuit 450.

The defective row address 520 is responsive to the incoming row address 512, which is extracted from the incoming memory address 510, and outputs the row alternate address 524, which is either an address or an index of an address. The address 520 does so by finding a match between the address 512 and one of its stored values and if it detects a match, it generates the row address match 522 to the row address select 526, which causes the latter to select the address 524 rather than the address 512 as its output, memory array row address 528. The address 528 is provided as input to the row decoder 504, which decodes the address 528 and uses the decoded row address to access a corresponding row in the memory array 502 and the spare array 503.

The column address map 540 is responsive to the incoming column address 514 and is analogous to the row address map 440 except that it is for looking up column addresses and not row addresses. The map 540 outputs the spare column index 542 for use by spare array column decoder 507, which decodes the alternate column address 542 and outputs the decoded address for use by the spare array column select 509, the select 560 further chooses between the output of the select 509 and the output of the column select 508 based upon the status of the column address defect signal 539. That is, if the signal indicates a defective column address, the select 560 selects the output of the select 509 to provide, as output 562, and if it does not indicate a defect, the select 560 chooses the output of the column select 508 as the output 562.

The defective column addresses 530 for groups a through g are analogous to the addresses 430 except that they store defective column addresses instead of defective row addresses and in this respect, they receive as input, the incoming row address 512 as their input. Similarly, the comparators 534.a through 534.g are analogous to the comparators 434.a through 434.g, respectively, but they compare column addresses and more specifically, the address of a respective defective column address with the incoming column address 514. If a match between the incoming column address 514 and one of the defective column addresses in the groups a through g of the tables 530 is found by the detector 538, the output of the detector so indicates and provides such input to the select 589 and based on the same in addition to the state of the flags 599, from the map 540, as processed by the select 589, the signal 539, which is the output of the select 589, causes the select 560 to choose between the output of the select 509 and the output of the column select 508. The detector 538 is therefore analogous to the detector 438. The flags 599 are a part of the address 542 and in an exemplary embodiment, take on values analogous to those shown in Table 1 hereinabove. As previously discussed, an index concatenated with a base address is used to generate 542, in an embodiment of the invention.

The store 552 or address 558 is not required for the case where the array 517 is made of MRAM cells.

Figure 7:
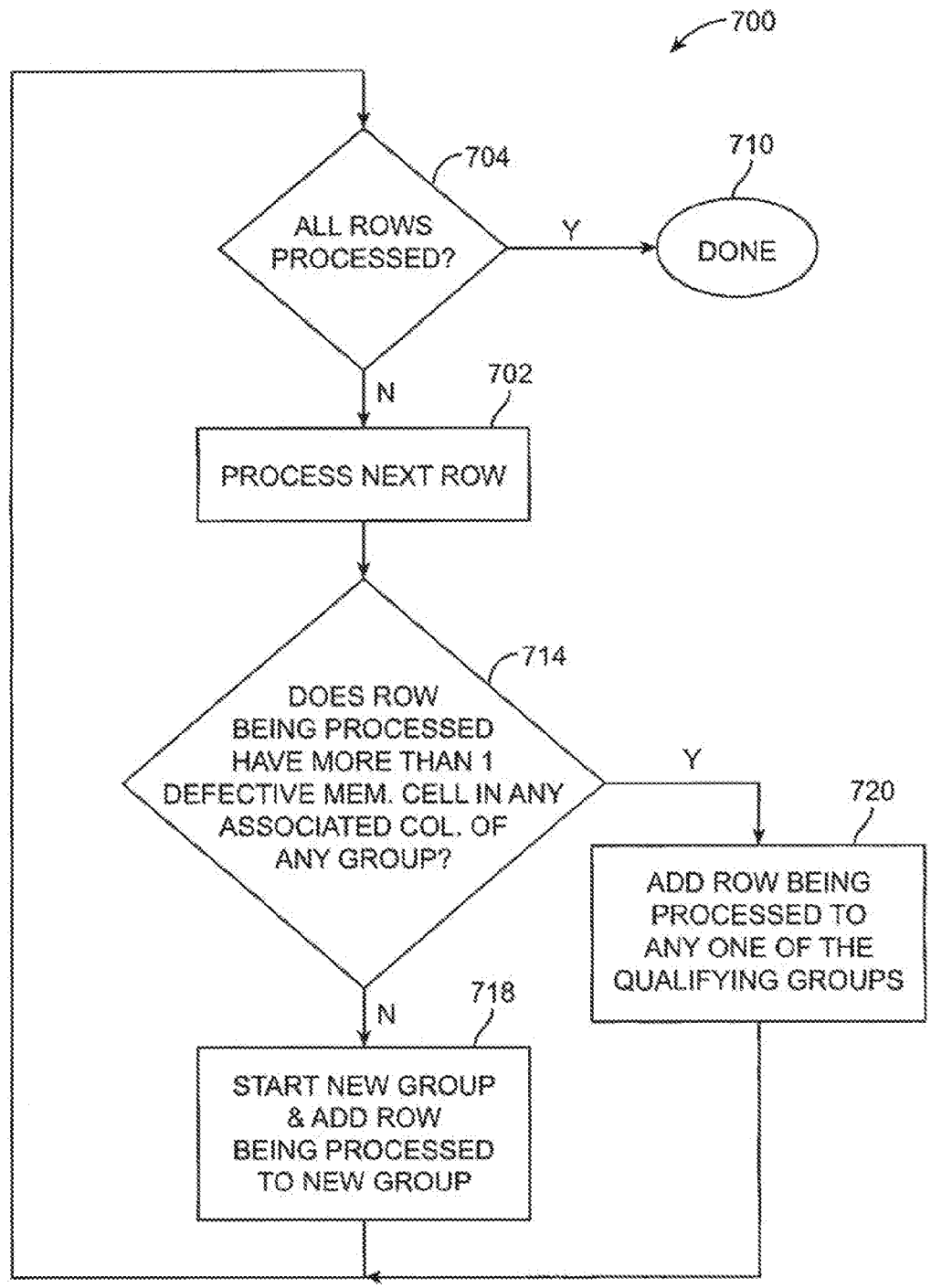
FIG. 7 shows a flow chart of the relevant steps performed in generating the groups of rows, in accordance with a method of the invention.

FIG. 7 shows a flow chart of the relevant steps performed in generating the groups of rows, in accordance with a method of the invention.

The process 700 is shown to start at 704 where a determination is made as to whether or not all rows have been processed and if so, the process completes at 710. Otherwise, the step 702 is performed where the next row is processed (or accessed), followed by another determination at 714. At 714, it is determined whether or not the row being processed has more than one defective memory cell in any of the associated columns of any of the groups and if so, the process continues to step 720 where the row being processed is added to any one of the groups that qualify. Groups that qualify are those with no more than one defective memory cell at a given column thereof. If, on the other hand, at 714, it is determined that the row being processed has more than one defective memory cell in any associated column of any group, the process proceeds to step 718 where a new group is started and the row being processed is added to the new group and the process continues to 704. An analogous process is undertaken in the case where columns are grouped.

Although the present invention has been described in terms of specific embodiments, it is anticipated that alterations and modifications thereof will no doubt become apparent to those skilled in the art. It is therefore intended that the following claims be interpreted as covering all such alterations and modification as fall within the true spirit and scope of the invention.

What is claimed is:

1. A method of managing random defects in a memory device comprising:

receiving an incoming address identifying a memory location to be accessed in a memory array of the memory device, the memory array being made of a plurality of memory cells, the incoming address including a row address and a column address, a row address and a column address identifying a memory location of a memory cell of the memory array, the column address belonging to a group of column addresses that are associated with a plurality of row addresses, each of the associated plurality of row addresses of a group of column addresses identifying no more than one defective memory cell;

determining whether or not the incoming address identifies a defective memory cell; and if the incoming column address identifies a defective memory cell, identifying an alternate column address;

for each group of column addresses, identifying a defective column address using the incoming row address;

comparing the incoming column address to the defective column address of each group; and if a match is found between the incoming column address and the defective column address of any of the groups, replacing the incoming column address with the alternate column address to be used for identifying an alternate memory location in the memory array;

determining whether or not the incoming row address is associated with a defective memory cell; and if it is determined that the incoming row address is associated with a defective memory cell, replacing the incoming row address with an alternate row address for identifying the alternate memory location in the memory device.

2. The method of managing, as recited in claim 1, further comprising determining that the memory cell is not defective using a predetermined value.

3. The method of managing, as recited in claim 1, further comprising determining that the memory cell is not defective using a flag.

4. The method of managing, as recited in claim 1, wherein if it is determined that there is no match between the incoming column address and the defective column address, using the incoming column address for identifying the memory location to be accessed.

5. The method of managing, as recited in claim 1, wherein if it is determined that there is no match between the incoming row address and the defective row address, using the incoming row address for identifying the memory location to be accessed.

6. The method of managing, as recited in claim 1, wherein the plurality of memory cells of the memory device are random access memory (RAM) cells.

7. The method of managing, as recited in claim 1, wherein the plurality of memory cells of the memory device are magnetic random access memory (MRAM) cells.

8. The method of managing, as recited in claim 1, further comprising using a content addressable memory (CAM) for the step of determining whether or not the incoming column address is associated with a defective memory cell.

* * * * *